United States Patent
Konecni et al.

(10) Patent No.: US 6,660,650 B1
(45) Date of Patent: Dec. 9, 2003

(54) SELECTIVE ALUMINUM PLUG FORMATION AND ETCHBACK PROCESS

(75) Inventors: Anthony J. Konecni, Plano, TX (US); Wei-yung Hsu, Dallas, TX (US); Qi-zhong Hong, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/467,108

(22) Filed: Dec. 17, 1999

Related U.S. Application Data

(60) Provisional application No. 60/113,135, filed on Dec. 18, 1998.

(51) Int. Cl.[7] ................................................. H01L 21/00
(52) U.S. Cl. ....................................... 438/720; 438/742
(58) Field of Search ................................ 438/719, 720, 438/723, 724, 755, 756, 757, 742

(56) References Cited

U.S. PATENT DOCUMENTS

| | | | | |
|---|---|---|---|---|
| 5,514,622 A | * | 5/1996 | Bornstein et al. | 437/189 |
| 5,637,534 A | * | 6/1997 | Takeyasu et al. | 438/637 |
| 5,652,180 A | * | 7/1997 | Shinriki et al. | 438/620 |
| 5,872,053 A | * | 2/1999 | Smith | 438/626 |
| 6,043,145 A | * | 3/2000 | Suzuki et al. | 438/622 |
| 6,110,828 A | * | 8/2000 | Guo et al. | 438/688 |
| 6,127,070 A | * | 10/2000 | Yang et al. | 430/5 |

OTHER PUBLICATIONS

T. Amazawa et al., "A 0.25um Via Plug Process Using Selective CVD Aluminum For Multilevel Interconnection", Electron Devices Meeting, 1991. IEEE Technical Digest., International, Dec. 8–11, 1991, pp 265–268.*

* cited by examiner

Primary Examiner—William A. Powell
(74) Attorney, Agent, or Firm—Wade James Brady, III; Frederick J. Telecky, Jr.

(57) ABSTRACT

An embodiment of the instant invention is a method of fabricating an electronic device over a semiconductor substrate having an interconnecting structure comprised of aluminum, the method comprising the steps of: forming a conductive structure (layers 120, 122 and 128 of FIGS. 1a–1d) comprised of a metal; forming a dielectric layer (layer 130 of FIGS. 1a–1d) over the conductive structure, the dielectric layer having an upper surface; forming an opening in the dielectric layer so as to expose a portion of the conductive structure, the opening having sidewalls; selectively depositing an aluminum-containing conductive material (material 136 and 137 of FIG. 1c) in the opening; and performing an etchback process so as to remove any of the aluminum-containing conductive material formed on the hardmask and so as to etchback any portion of the aluminum-containing conductor which is situated over the upper surface of the dielectric layer. In an alternative embodiment, the method further comprises the step of: forming a hardmask on the upper surface of the dielectric layer, the hardmask having an upper surface and is formed prior to the step of forming an opening in the dielectric layer; and wherein an opening is formed in the hardmask prior to the step of forming an opening in the dielectric layer.

16 Claims, 2 Drawing Sheets

SELECTIVE ALUMINUM PLUG FORMATION AND ETCHBACK PROCESS

This application claims priority under 35 USC §119(e)(1) of provisional application No. 60/113,135 filed Dec. 18, 1998.

CROSS-REFERENCE TO RELATED PATENT/PATENT APPLICATIONS

The following commonly assigned patent/patent applications are hereby incorporated herein by reference:

| Patent No./Serial No. | Filing Date | TI Case No. |
| --- | --- | --- |
| 09/467,108 | 12/17/1999 | TI-23187 |
| 08/988,686 | 12/11/1997 | TI-22166 |

FIELD OF THE INVENTION

The instant invention pertains to semiconductor device fabrication and processing and more specifically to a method of fabricating an aluminum plug with an etchback process.

BACKGROUND OF THE INVENTION

Presently, in the semiconductor device manufacturing industry, manufacturers are constantly trying to reduce the size of the semiconductor devices while also trying to reduce the power consumed by each device. In order to make the devices smaller, so as to fit more devices within a given area, the devices are made to be more compact. This can be problematic with respect to the conductive structures because the resistance of a conductor is proportional to the resistivity of the material used but inversely proportional to the cross-sectional area of the conductor. Hence, as the cross-sectional area is reduced the resistivity should be reduced so as to offset the difference in the resistance of the structure. Furthermore, since the other trend in the industry relates to the reduction of power consumption by the device, it is preferable to reduce the resistivity of the conductor as much as possible, because power consumption is proportional to the resistance of the conductive structure.

Tungsten plugs have been used for via and contact fill for quite some time in the semiconductor manufacturing industry. However, its resistivity is higher than other conductors and as contact and via diameters become smaller and aspect ratios become larger, these vias become more difficult to fill with traditional tungsten deposition techniques. In addition, traditional tungsten deposition techniques (usually accomplished by chemical vapor deposition, CVD, of the tungsten) require barrier and glue layers which raise the processing cost and complexity. Selective tungsten formation has been attempted but has not lead to any practical semiconductor processes.

Due to the lower resistivity of aluminum as compared to tungsten, aluminum plugs offer the potential for lower via and contact resistance. Sputter-reflow of aluminum is a relatively inexpensive alternative to CVD tungsten, but it has not been successfully implemented for technology nodes less than 0.35 micron. CVD aluminum is an alternative to CVD tungsten processing and is being investigated throughout the industry for various structures. In addition, since CVD aluminum requires lower processing temperatures, it can be integrated with polymer-based low dielectric constant dielectrics. However, due to its nonconformal nature, blanket CVD aluminum is subject to void formation when used to form the plug in a via with a higher aspect ratio or when the via or contact is small. Another disadvantage of CVD aluminum is that it should be formed on a nucleation layer.

Selective CVD aluminum has been attempted in the industry. Basically, it involves the selective deposition of aluminum on metal surfaces without being deposited on oxide surfaces. With respect to via or contact formation, the via or contact is formed upwardly from the bottom, thereby eliminating the void formation that blanket aluminum deposition suffers from when the topography is re-entrant. One advantage of this method is that it can be used to fill deep submicron vias and contacts without voids. In addition, selective CVD aluminum does not require an underlying liner or nucleation layer.

A couple issues with selective CVD aluminum processing involve the removal of any undesired non-selective depositions and the recessing of the plug. For plug recessing and the removal of any unwanted non-selective deposition, chemical mechanical polishing (CMP) of the aluminum has been used, but CMP can be costly and complex. Aluminum CMP and cleanup processing is still relatively new and they are problematic due to dishing and scratching of the soft aluminum.

SUMMARY OF THE INVENTION

An embodiment of the instant invention is a method of fabricating an electronic device over a semiconductor substrate having an interconnecting structure comprised of aluminum, the method comprising the steps of: forming a conductive structure comprised of a metal; forming a dielectric layer over the conductive structure, the dielectric layer having an upper surface; forming an opening in the dielectric layer so as to expose a portion of the conductive structure, the opening having sidewalls; selectively depositing an aluminum-containing conductive material in the opening; and performing an etchback process so as to remove any of the aluminum-containing conductive material formed on the hardmask and so as to etch back any portion of the aluminum-containing conductor which is situated over the upper surface of the dielectric layer. In an alternative embodiment, the method further comprises the step of: forming a hardmask on the upper surface of the dielectric layer, the hardmask having an upper surface and being formed prior to the step of forming an opening in the dielectric layer; and wherein an opening is formed in the hardmask prior to the step of forming an opening in the dielectric layer. Preferably, the hardmask is comprised of material which is etched using an etchant which does not substantially etch the dielectric layer. This material is preferably a nitride (more preferably, silicon nitride). The aluminum-containing conductive material is comprised of: substantially pure aluminum or an aluminum alloy. The conductive structure is comprised of: aluminum or a TiN structure situated on an aluminum structure. Preferably, the exposed conductive structure is the aluminum structure.

Another embodiment of the instant invention is a method of fabricating an electronic device over a semiconductor substrate having an interconnecting structure comprised of aluminum, the method comprising the steps of: forming a conductive structure comprised of aluminum; forming a dielectric layer over the conductive structure, the dielectric layer having an upper surface; forming a hardmask layer on the upper surface of the dielectric layer, the hardmask having an upper surface and comprised of silicon nitride; forming an opening in the hard mask so as to expose a portion of the dielectric layer, the opening having sidewalls; forming an opening in the exposed portion of the dielectric layer so as to expose a portion of the conductive structure, the opening having sidewalls; selectively depositing an aluminum-containing conductive material in the opening; performing an etchback process so as to remove any of the aluminum-containing conductive material formed on the hardmask and so as to etch back any portion of the aluminum-containing conductor which is situated over the upper surface of the hardmask; and wherein the dielectric layer is not substantially etched by the etchant used to etch the opening in the hardmask. Preferably, the aluminum-containing conductive material is comprised of: substantially pure aluminum or an aluminum alloy. The conductive structure is, preferably, comprised of a TiN structure situated on an aluminum structure and the exposed portion of the conductive structure is the aluminum structure.

BRIEF DESCRIPTION OF THE DRAWINGS

Similar reference numerals are used throughout the figures to designate like or equivalent features. The figures are not drawn to scale. They are merely provided to illustrate the affect of the method of the instant invention.

DETAILED DESCRIPTION OF THE DRAWINGS

The instant invention involves a method of forming a contact or via which utilizes selective aluminum formation along with an aluminum plug etchback process that is less costly and more simple than the standard CMP process for removing the non-selective deposition and excess aluminum plug material. However, the instant invention may be implemented in any type of aluminum plug formation process flow. The formation of the aluminum does not have to be accomplished by selective-CVD. The etchback process may use $BCl_3$, $Cl_2$ or any other chlorine-containing etch chemistries.

Figure 1A:
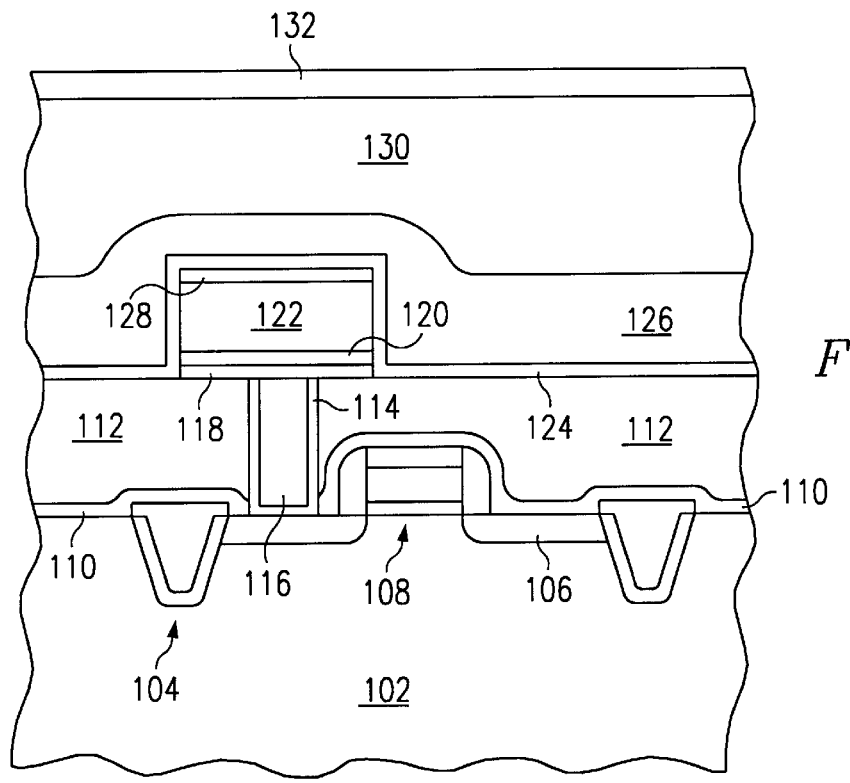
FIGS. 1a–1d are cross-sectional views of a partially fabricated device which is fabricated using the method of one embodiment of the instant invention.

Referring to FIG. 1a, isolation structures 104 are formed in substrate 102 (which may be comprised of single crystal silicon or an epitaxial silicon layer formed on a single crystal silicon body). Isolation structures 104 are illustrated as trench isolation structures but they can be formed as LOCOS isolation structures and/or junction isolation structures. Gate structure 108 is formed over substrate 102 and source/drain regions 106 are preferably aligned to gate structure 108. Preferably, gate structure 108 is comprised of a gate dielectric (which may be comprised of silicon dioxide, silicon nitride, an oxynitride, or a higher dielectric constant material such as PZT, BST, or tantalum pentoxide), sidewall spacers (preferably comprised of silicon dioxide, silicon nitride or an oxynitride), and a conductive structure which may be a silicided doped polycrystalline structure (shown) or a metal structure (preferably comprised of tungsten, TiN, aluminum, copper, or another metal conductor). A conformal layer 110 is preferably formed over gate 108, source/drain regions 106 and isolation structure 104, and is preferably comprised of a insulating material such as silicon nitride or silicon dioxide. Insulating layer 112 (preferably comprised of TEOS, PETEOS, silicon dioxide, BPSG, PSG, FSG, silicon oxide, or a combination of one or more of the above) is formed over layer 110 and an opening is formed in it to form a contact to gate structure 108 and/or source/drain regions 106. If plug 116 is formed of CVD aluminum or tungsten then liner/barrier layer 114 is preferably formed. Layer 114 is preferably comprised of either TiN or a Ti/TiN stack.

Figure 1B:
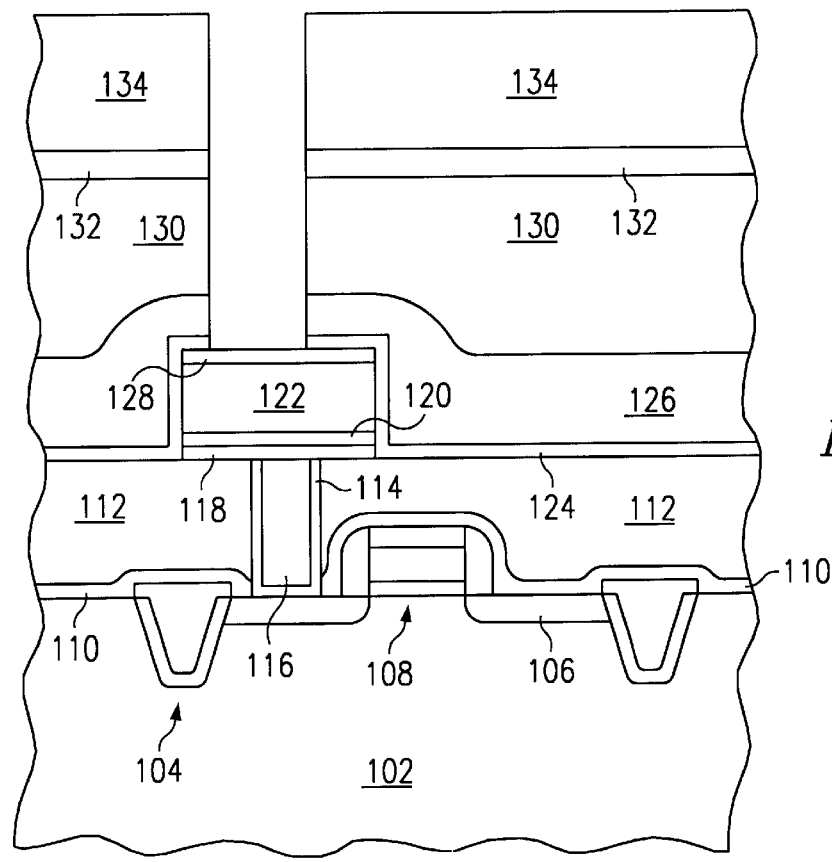

Next, an interconnect 122 is formed. Preferably, the interconnect will be comprised of a conductive material such as aluminum, aluminum doped with 0.5 to 2.0 percent by weight of copper, or even substantially pure copper. The interconnect is also, preferably but not necessarily, comprised of underlying Ti layer 118 and/or TiN layer 120 and overlying layer 128, which is preferably comprised of Ti, TiN and/or an antireflective coating. A liner layer 124 is preferably blanketly formed so as to prevent leakage from the interconnect structure to an adjacent interconnect structure. Liner layer 124 may be comprised of silicon nitride, silicon dioxide, PETEOS, or a combination of the above. Dielectric layer 126 is formed on liner layer 124 and is preferably comprised of a lower dielectric constant material such as HSQ, aerogel, xerogel, FSG, or a low-k polymer. Layer 126 is important to reduce the interaction between adjacent interconnect structures. A second dielectric layer (layer 130) which can be planarized may be formed on layer 126. Preferably, layer 130 is comprised of silicon dioxide, TEOS, PETEOS, PSG, FSG, BPSG, or other glass material. Hard mask 132 is preferably formed on layer 130. Hard mask layer 132 should be comprised of a material which is etched in an etchant which does not substantially etch underlying layers 130 and 126 (and vice versa). This is done so that as layers 126, 128 and 130 are etched using a photoresist mask 134 (FIG. 1b) as a mask. The sidewalls of this opening remain vertical because hard mask 132 will not be substantially etched by this etchant but photoresist mask 134 may erode during this etch process.

Figure 1C:
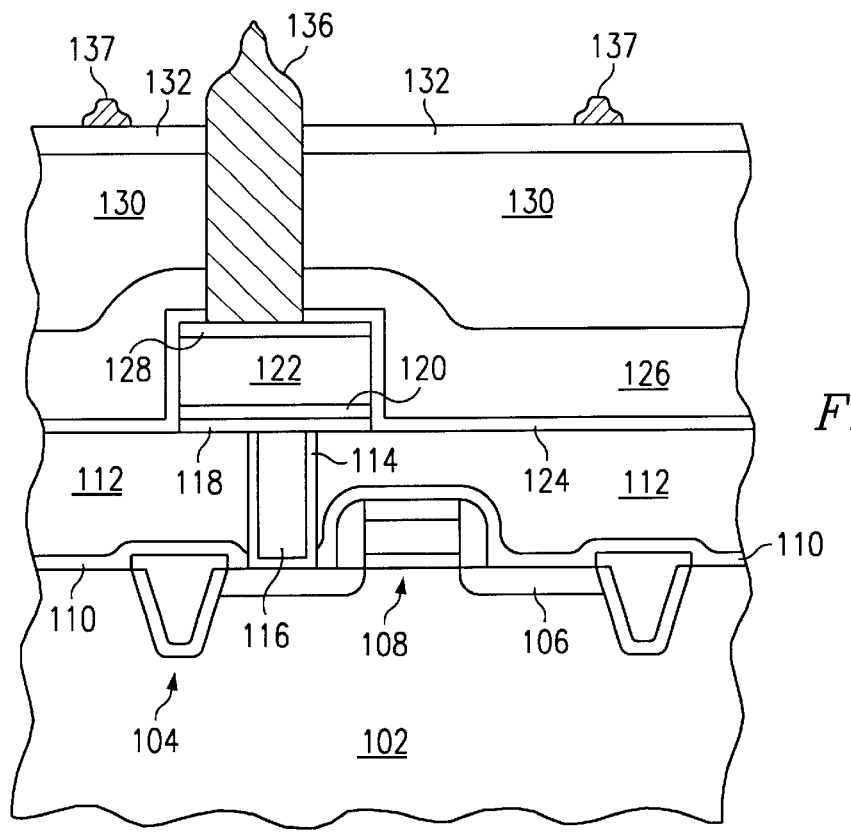

Referring to FIG. 1c, once the opening is formed and either liner/barrier layer 128 or conductive structure 122 is exposed plug 136 is formed. Preferably, plug 136 is formed by selective deposition of aluminum. This is preferably accomplished using metal precursor (such as DMAH, TMA, TMAA, or other commonly used precursor), at a pressure around 1 to 3 Torr (more preferably around 2 Torr) and at a temperature around 200 to 300 C. (more preferably around 240 to 260 C.) for approximately 5 to 60 seconds (more preferably around 10 seconds). Using this process, the aluminum will form upwardly from the bottom exposed conductor. Since this is a selective process, aluminum should preferably be formed over the exposed conductor and not on layer 132. However, some aluminum 137 will be deposited on layer 132.

Figure 1D:
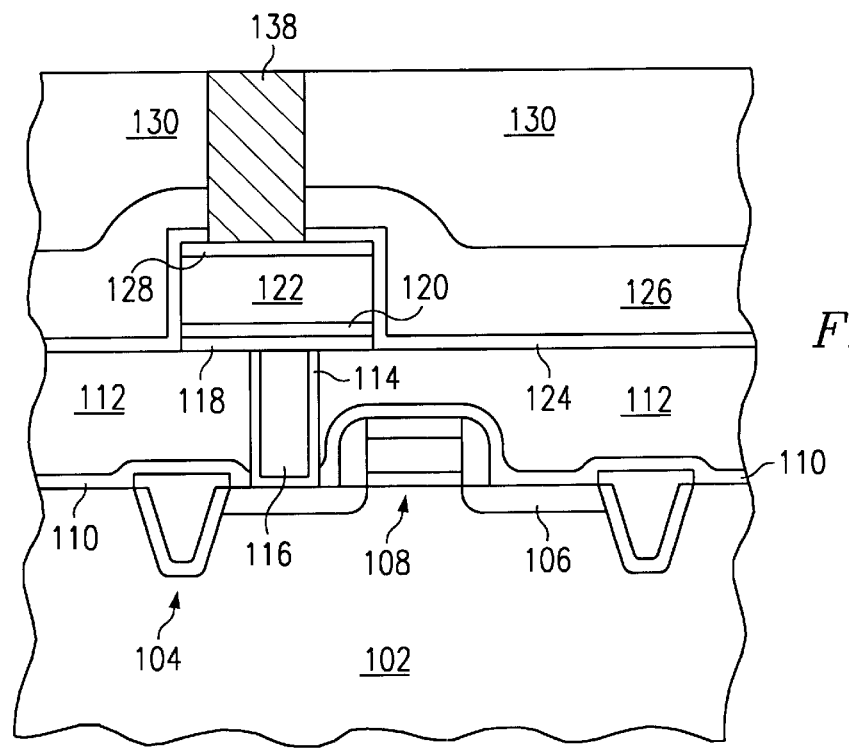

Referring to FIG. 1d, in order to remove extraneous material 137 and the portion of plug 136 which overlies the uppermost surface of layer 132 an etchback process is performed, next. Preferably, this is accomplished by subjecting the wafer to an etchant, such as $BCl_3$ or $Cl_2$, at a pressure around 5 to 20 mTorr (more preferably around 10 mTorr) and at a temperature around 25 to 100 C. (more preferably around 35 C.) for around 2 to 30 seconds (more preferably around 3 to 10 seconds). Hardmask layer 132 may or may not be removed. If it is removed, it may be removed either during or after the etchback process (preferably after if at all).

While the above description of the invention specifically refers to a selectively deposited aluminum plug structure, the instant invention can be used on aluminum or aluminum doped with copper plug structures. In addition, the formation step does not have to be accomplished by selective deposition.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of fabricating an electronic device over a semiconductor substrate having an interconnecting structure, said method comprising the steps of:

forming a metallic electrically conductive structure;

forming a dielectric having at least one layer over said electrically conductive structure, said dielectric having an upper surface;

forming a hardmask on said upper surface of said dielectric having an upper surface and an opening therethrough extending to said upper surface, said opening formed by etching said hardmask with an etchant which does not substantially etch said dielectric;

then forming an opening in said dielectric extending from said opening in said hardmask to expose a portion of said electrically conductive structure with an etchant which does not substantially etch said hardmask, said opening having sidewalls;

selectively depositing an aluminum-containing electrically conductive material into said opening; and above and over said hardmask; and then performing an etchback process to remove any of the aluminum-containing conductive material formed on said hardmask and to etch back any portion of said aluminum-containing conductor which is situated over said upper surface of said dielectric.

2. The method of claim 1 wherein said dielectric has a plurality of layers and is formed by the steps of providing a first layer over said conductive structure having a first predetermined dielectric constant, providing a second layer over said first layer having a dielectric constant lower than said first layer and providing a third planarized layer over said second layer having a dielectric constant larger than said second layer.

3. The method of claim 1, wherein said hardmask is comprised of material which is etched using an etchant which does not substantially etch said dielectric layer.

4. The method of claim 3, wherein said hardmask is comprised a nitride.

5. The method of claim 4, wherein said hardmask is comprised of silicon nitride.

6. The method of claim 1, wherein said aluminum-containing conductive material is substantially pure aluminum.

7. The method of claim 1, wherein said aluminum-containing conductive material is an aluminum alloy.

8. The method of claim 1, wherein said metal is aluminum.

9. The method of claim 1, wherein said metal is comprised of a TiN structure situated on an aluminum structure.

10. The method of claim 9, wherein said exposed conductive structure is said aluminum structure.

11. A method of fabricating an electronic device over a semiconductor substrate having an interconnecting structure, said method comprising the steps of:

forming an electrically conductive structure;

forming a dielectric having at least one layer over said electrically conductive structure, said dielectric having an upper surface;

forming a hardmask layer on said upper surface of said dielectric, said hardmask having an upper surface and comprised of silicon nitride;

forming an opening in said hardmask to expose a portion of said dielectric, said opening having sidewalls;

then forming an opening in said exposed portion of said dielectric extending from said opening in said hard mask to expose a portion of said electrically conductive structure; said opening having sidewalls;

selectively depositing an aluminum-containing conductive material in said opening extending over and onto said hardmask; and then performing an etchback process to remove any of the aluminum-containing conductive material formed on said hardmask and to etchback any portion of said aluminum-containing conductor which is situated over said upper surface of said hardmask;

said dielectric layer not being substantially etched by the etchant used to etch the opening in said hardmask.

12. The method of claim 11, wherein said aluminum-containing conductive material is substantially pure aluminum.

13. The method of claim 11, wherein said aluminum-containing conductive material is an aluminum alloy.

14. The method of claim 1, wherein said conductive structure is comprised of a TiN structure situated on an aluminum structure.

15. The method of claim 9, wherein said exposed portion of said conductive structure is said aluminum structure.

16. The method of claim 11 wherein said dielectric has a plurality of layers and is formed by the steps of providing a first layer over said conductive structure having a first predetermined dielectric constant, providing a second layer over said first layer having a dielectric constant lower than said first layer and providing a third planarized layer over said second layer having a dielectric constant larger than said second layer.

* * * * *